United States Patent
Reynolds et al.

(10) Patent No.: US 6,910,002 B1
(45) Date of Patent: Jun. 21, 2005

(54) METHOD AND APPARATUS FOR SPECIFYING ADDRESSABILITY AND BUS CONNECTIONS IN A LOGIC DESIGN

(75) Inventors: Bart Reynolds, Seattle, WA (US); Cheng-I Chuang, Saratoga, CA (US); Chukwuweta Chukwudebe, Berkeley, CA (US); Sridhar Krishnamurthy, San Jose, CA (US); Damon McCormick, Mountain View, CA (US); Tom Shui, Mountain View, CA (US); Kai Zhu, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 315 days.

(21) Appl. No.: 09/649,437

(22) Filed: Aug. 23, 2000

(51) Int. Cl.[7] .............................................. G06F 17/50
(52) U.S. Cl. ......................... 703/14; 710/66; 710/307; 711/170; 711/202; 712/300
(58) Field of Search .............................. 703/14; 710/66, 710/307; 711/202, 170; 712/300; 716/18

(56) References Cited

U.S. PATENT DOCUMENTS

| | | | |
|---|---|---|---|
| 4,947,366 A | | 8/1990 | Johnson |
| 5,278,847 A | * | 1/1994 | Helbig et al. ............... 714/764 |
| 5,438,509 A | * | 8/1995 | Heffron ...................... 709/100 |
| 5,446,845 A | * | 8/1995 | Arroyo et al. ............... 710/307 |
| 5,666,508 A | | 9/1997 | Marshall, Jr. |
| 5,835,926 A | | 11/1998 | Pesuit |
| 6,026,239 A | | 2/2000 | Patrick et al. |
| 6,324,678 B1 | * | 11/2001 | Dangelo et al. .............. 716/18 |
| 6,393,548 B1 | * | 5/2002 | Kerstein et al. .............. 712/43 |
| 6,434,654 B1 | * | 8/2002 | Story et al. .................. 710/307 |
| 6,449,706 B1 | | 9/2002 | Chen et al. |
| 6,457,115 B1 | | 9/2002 | McGrath |
| 6,480,948 B1 | * | 11/2002 | Virajpet et al. ............. 711/202 |

FOREIGN PATENT DOCUMENTS

WO         WO 00/22546         4/2000

OTHER PUBLICATIONS

Computer Architecture A Quantitative Approach, by John L. Hennessy et al, Second Edition, Morgan Kaufmann, 1996, ISBN 1-55860-329-8, pp. 73-74.*
Advanced Microprocessors, by Daniel Tabak, McGraw-Hill, Inc., ISBN: 0-07-062843-2, 1995, pp. 1-79.*

* cited by examiner

Primary Examiner—Kevin J. Teska
Assistant Examiner—Eduardo Garcia-Otero
(74) Attorney, Agent, or Firm—Blakely, Sokoloff; Kim Kanzaki (57) ABSTRACT

In one embodiment, a method for specifying addressability in a memory-mapped device is disclosed. A data access primitive is used to model addressablity for the memory-mapped device. Addressability comprises an address matching function, a lane matching function and one or more bus connections. A first starting address for the memory-mapped device is specified. A first set of addressing matching function, lane matching function and one or more bus connections for the memory-mapped device is generated using the data access primitive and the first starting address.

29 Claims, 7 Drawing Sheets

METHOD AND APPARATUS FOR SPECIFYING ADDRESSABILITY AND BUS CONNECTIONS IN A LOGIC DESIGN

FIELD OF THE INVENTION

The present invention relates generally to the field of logic design. More specifically, the present invention is directed to a method and an apparatus for specifying addressability and bus connections.

BACKGROUND

Logic designers use hardware description language (HDL) or schematic capture to model a circuit at different level of abstractions. The circuit model is synthesized to construct a gate-level netlist. System designs that include memory-mapped devices require the logic designer to fully specify the addressability and bus connections of the memory-mapped device in the logic design. Great caution is exercised when specifying the addressability and bus connections for memory-mapped devices interacting with multi-byte system buses. Traditional electronic design automation tool flows require the addressability and data connections of a device to a system bus to be explicitly specified. This includes address matching, lane matching, connections to system bus data bits and any other auxiliary logic.

In the case of an 8-bit system bus, where only byte-wide transactions are supported, the specifications of addressability and bus connections is fairly obvious. The lane-matching function is unnecessary because all transactions are byte-wide. All devices connect to the same bits (bits 7:0) of the data bus. Although specifying the addressability and bus connections may be tedious when designing for an 8-bit system bus, there is little danger of accidentally specifying inconsistent addressability and bus connections.

In the case of a 32-bit system bus, where byte-wide, halfword-wide, and word-wide transactions are supported, the connections between the device and the system bus are much more complex. The interdependencies between the address-matching function, the lane-matching function, and the connections to the data bus make it much more likely that the logic designer will accidentally specify inconsistent addressability and bus connection information.

Because the bus connections and lane-matching function must be consistent with the address-matching function, it is not possible to change the address of a memory-mapped device without invalidating the lane-matching function and bus connectivity.

SUMMARY OF THE INVENTION

In one embodiment, a method for specifying addressability in a memory-mapped device is disclosed. A data access primitive is used to model addressability for the memory-mapped device. Addressability comprises an address matching function, a lane matching function and one or more bus connections. A first starting address for the memory-mapped device is specified. A first set of addressing matching function, lane matching function and one or more bus connections for the memory-mapped device is generated using the data access primitive and the first starting address.

Other features and advantages of the present invention will be apparent from the accompanying drawings and from the detailed description which follows.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DETAILED DESCRIPTION

In one embodiment, a method for specifying addressability for a memory-mapped device is disclosed. An intended advantage of this method is to simplify the task of the logic designer when specifying the addressability and bus connections of a memory-mapped logic device.

Figure 1:
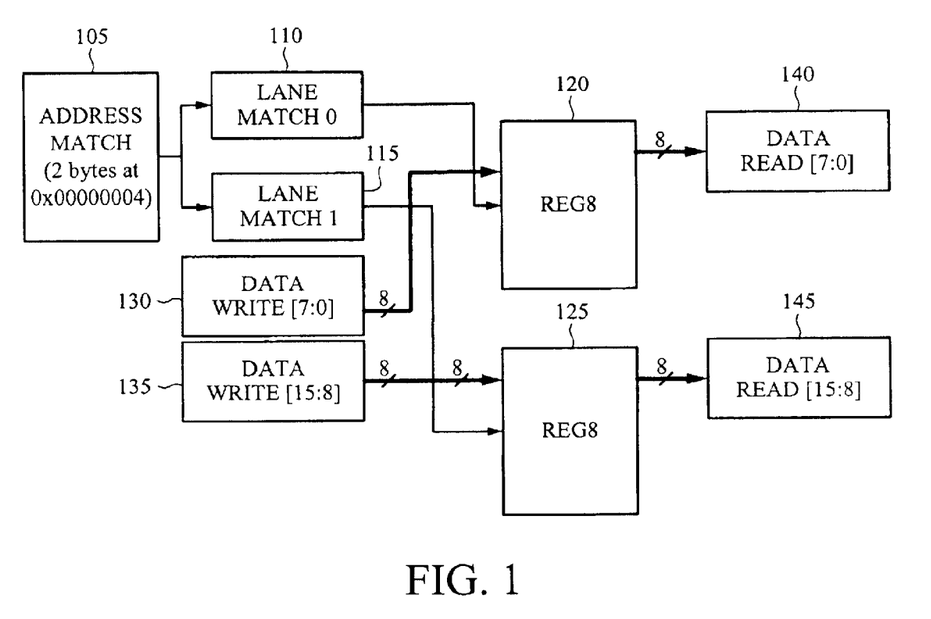
FIG. 1 is an exemplary logic diagram showing explicit addressability and bus connections.

FIG. 1 is an exemplary logic diagram showing explicit address-matching functions, lane matching functions and data bus connections. FIG. 1 shows a memory mapped 2-byte device (e.g., register) with individually addressable bytes 120, 125. Other signals not shown in FIG. 1 may include, for example, addresses, data, clock, wait, read, write, etc. Address-matching function 105 is typically specified as a set of logic gates (in schematic capture) or a logic equation (in hardware description language ("HDL")) that is synthesized to a set of gates. The address-matching function 105 determines the addresses the memory-mapped device is mapped to. The address-matching function 105 also performs address-decoding function. At design time, a constant address is specified. At run time, during operation of the logic, the address decoding function compares the constant against the addresses seen on the bus to see if there is a match.

The lane-matching function which includes Lane Match 0 110 and Lane Match 1 115, is also specified as a set of logic gates (in schematic capture) or a logic equation (in HDL) that is synthesized to a set of gates. The lane-matching function suppresses the address-matching function for certain bus transaction sizes and alignments. For example, for the 2-byte register with the individually addressable bytes shown in FIG. 1, there may be a single address-matching function 105 with a distinct lane-matching function for each byte. The Lane Match 0 lane-matching function 110 would match all transactions (e.g., read, write) that include the first byte. The Lane Match 1 lane-matching function 115 would match all transactions that include the second byte. The logic diagram of FIG. 1 would require the logic designer to explicitly specify connections to system bus data bits. The first byte 120 of the 2-byte register would connect to a set of eight different system bus data bits (0 to 7) 130. Similarly, the second byte 125 of the 2-byte register would connect to another set of eight different system bus data bits (8 to 15) 135.

For example, in a 2-byte transaction to the register at address 0x00000004, when there is a match, the Lane Match 0 lane-matching function 110 would match the first byte address 0x00000004. The Lane Match 1 lane-matching function 115 would match the second byte address 0x00000005. The address 0x00000004 refers to the first byte 120 of the register, and the address 0x00000005 refers to the second byte 125 of the register. When there is a write transaction, the first data byte 130 is written into the first byte of the register 120 and the second data byte 135 is written into the second byte of the register 125. When there is a read transaction, the first data byte 140 and the second data byte 145 from the register is provided to the respective bits of the data bus.

The address 0x00000004 in this example is a constant specified at design time. When there is a need to make any changes to the design of the memory-mapped device, such as, for example, the address constant, the logic designer has to make the change to the lane matching and the related connections. For example, for a 32-bit data bus, when the logic designer wants to change the address from 0x00000004 to 0x00000006, this requires the lane matching function to match the first byte to Lane Match 2 (not shown) and the second byte to Lane Match 3 (not shown). The corresponding data bytes would be from bits 15–23 for the first data byte and bits 24–31 for the second data byte (i.e., the second half of the word). This would require having to change and recompile the HDL source and the schematic.

In one embodiment, the method of the present invention allows the logic designer to specify addresses for an addressable entity without having to be involved in the detailed requirement of address matching and lane matching. The logic designer uses a set of logic design components, referred to herein as "data access primitives", to specify an assembly of address and lane-matching logic and associated data bus connections. The data access primitive hides the details of interconnection to the bus, and abstracts away the interdependency of address-matching functions, lane-matching functions, and data bus connections.

Figure 2:
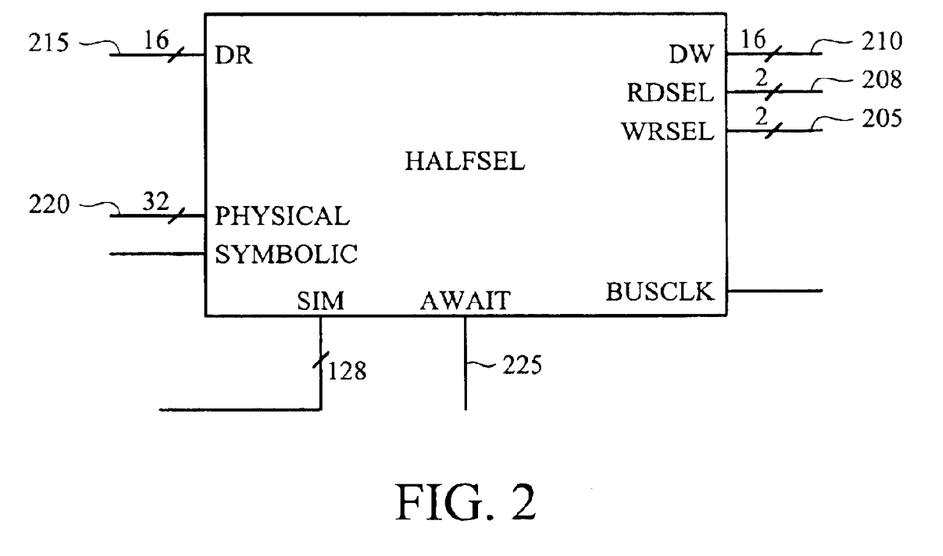
FIG. 2 is an exemplary diagram of a halfword selector data access primitive.

FIG. 2 is an exemplary diagram of a halfword selector data access primitive. Each data access primitive implies an address-matching function, one or more lane-matching functions, and bus connections for one or more bytes of data, as well as auxiliary logic. The data access primitive in FIG. 2 is referred to herein as "HALFSEL" data access primitive. The HALFSEL data access primitive is a fully addressable data access primitive because it can be used to connect a byte-, a halfword-, or a word-addressable 2-byte entity to the data bus.

The write-select (WRSEL) port 205 has two lines, one for each byte of the halfword. During a halfword or word write transaction, both lines of the WRSEL port 205 go high when there is an address match. During a byte write transaction, at most one of the lines of the WRSEL port 205 goes high when there is an address match. Similarly, the read-select (RDSEL) port 208 has two lines and goes active during a read transaction when the addresses and lanes match. The HALFSEL data access primitive includes a data write port (DW) 210 and a data read port (DR) 215. The data read port provides data from the device to the bus. The data write port receives data from the bus. For read-only data, the WRSEL port 205 and the DW port 210 are not connected. For write-only data, the DR port 215 is tied low.

The physical port 220 has the address constant indicating the starting address of the memory-mapped device. The autowait (AWAIT) port 225 is a constant flag. When the AWAIT flag is high, one wait state is automatically generated to indicate to a device reading this address that it is going to take an additional bus clock cycle to get the data out of the memory mapped device. When the flag is low, there is no wait state. In another embodiment, the AWAIT port 225 can be configured to be multiple bits wide to enable encoding of additional wait states. The BUSCLK port receives clock signals from a bus coupled to the halfword selector data access primitive. The SIM port is a bi-directional port connected to the system bus functional model during simulation, allowing the socket primitives to be simulated in the context of various bus transactions. The SYMBOLIC port receives a symbolic address that is part of an address space. One skilled in the art would recognize that other wait states beyond those asserted by the data access primitive may be asserted by other logic in the design, depending on the needs of the design.

Figure 3:
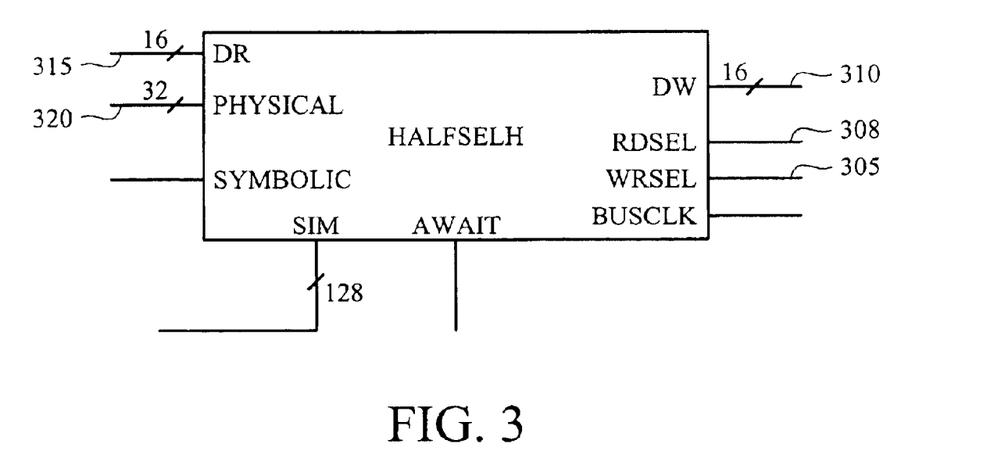
FIG. 3 is an exemplary diagram of another halfword selector data access primitive.

FIG. 3 is an exemplary diagram of another halfword selector data access primitive. The data access primitive in FIG. 3 is referred to herein as "HALFSELH" data access primitive. The ports in the HALFSELH data access primitive have the same function as for the HALFSEL data access primitive ports described above with respect to FIG. 2. The HALFSELH data access primitive is a restricted data access primitive because it can be used to connect a halfword-, or a word-addressable half-word entity to the data bus. The HALFSELH can not be used to address a byte of the half-word entity, which is different from the fully addressable HALFSEL data access primitive. The write-select (WRSEL) port 305 has one line which is shared by both bytes of the halfword. During a halfword or word write transaction, the line goes high when there is an address match. The read-select (RDSEL) port 308 has one line and goes high during a read transaction when the address matches. The HALFSELH data access primitive includes a data write port (DW) 310 and a data read port (DR) 315.

Figure 4:
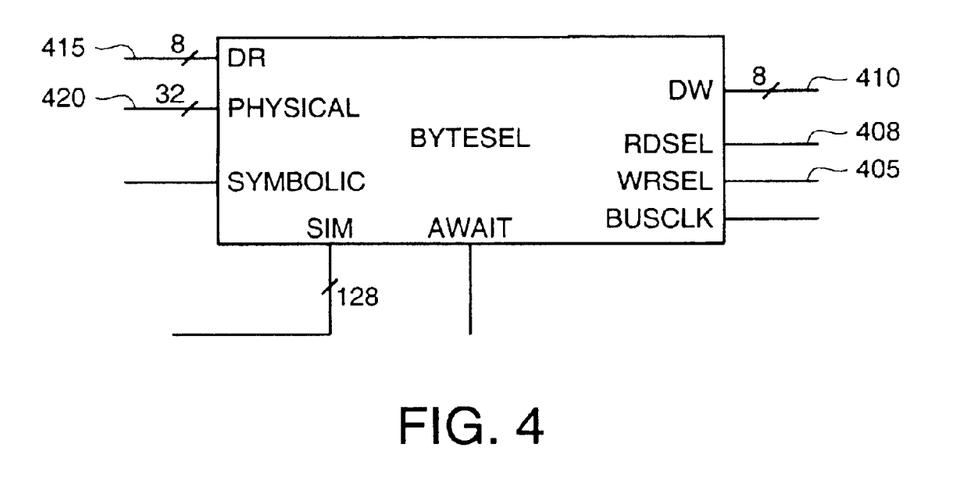
FIG. 4 is an exemplary diagram of a byte selector data access primitive.

FIG. 4 is an exemplary diagram of byte selector data access primitive. The data access primitive in FIG. 4 is referred to herein as "BYTESEL" data access primitive. The ports in the BYTESEL data access primitive have the same function as the HALFSEL data access primitive ports described above with respect to FIG. 2. The BYTESEL data access primitive is a fully addressable data access primitive because it can be used to connect a one-byte entity to the data bus. The BYTESEL data access primitive is very similar to the HALFSEL data access primitive, except that the write-select (WRSEL) port 405 and the read-select (RDSEL) 408 each has one line (bit) instead of two lines. The BYTESEL data access primitive also differs from the HALFSEL data access primitive in that it matches only a single byte rather than two bytes.

The data access primitives do not instantiate the logic (e.g., registers or RAMs) that stores the data being accessed. The data access primitives provide the addressability and data bus connections for the logic. Using the data access primitive such as, for example, the HALFSEL or the HALFSELH, the logic designer does not have to be involved with the complication of lane matching or addressability at design time or at subsequent changes. One skilled in the art will recognize that other data access primitives such as, for example, WORDSEL and WORDSELW, can also be implemented using the descriptions described above.

Although a data access primitive may require the logic designer to specify an explicit starting address for the physical port, the logic designer may leave the starting address of a data access primitive unspecified. The logic designer may choose to allow the starting address to be automatically assigned by an address allocator. The logic designer may choose to specify or restrict the starting addresses to be assigned to data access primitives using one or more address constraints. For example, the address constraints may be a block of addresses to be excluded or a specific starting address. In one embodiment, the address allocator is a software program that ensures that all of the data access primitives have fully specified addressability information. The address allocator reconciles the addressability specified in the logic design with the address constraints specified by the logic designer.

In one embodiment, a mapper program, referred to herein as a data access technology mapper, converts the data access primitives into low-level logic components necessary to implement the address-matching function, lane-matching function, bus connections, and auxiliary logic described above in FIG. 1. The data access technology mapper replaces the data access primitives with low-level logic components whose type and interconnection depend on both the type of the data access primitive and the starting address. The starting address may be either allocated by the address allocator or specified by the user. The data access technology mapper uses the starting address which is allocated by the address allocator and decides how the lane matching should be done among the components and which data should be read from the register. The exact mapping from data access primitives to low-level logic components depends on the implementation technology targeted by the data access technology mapper. For example, in the case of a Configurable System-on-Chip (CSoC), the data access technology mapper converts each data access primitives into one or more address selectors and multiple socket primitives for connecting to the system bus signals.

In one embodiment, the data access technology mapper combines the addressability implied by the data access primitives and the output of the address allocator program. By incorporating a data access primitive into a design, the logic designer can specify a complex assembly of address and lane-matching logic and associated data bus connections easily and without risk of specifying inconsistent information. At a later time, the logic designer can change the address for the data access primitive just by changing the address constraints. The logic designer does not have to change the logic design.

The data access primitives in the present invention are not implemented as a traditional logic macro. Although the data access primitive simplifies and abstracts the specification of logic design, the data access primitive is not a fixed composition of lower-level logic components. The data access technology mapper decides how to decompose the data access primitive, and that decomposition is dependent directly on the address assigned to the data access primitive. For example, depending on the address specified by the logic designer, the HALFSEL data access primitive may be converted by the data access technology mapper into different implementations.

Figure 5:
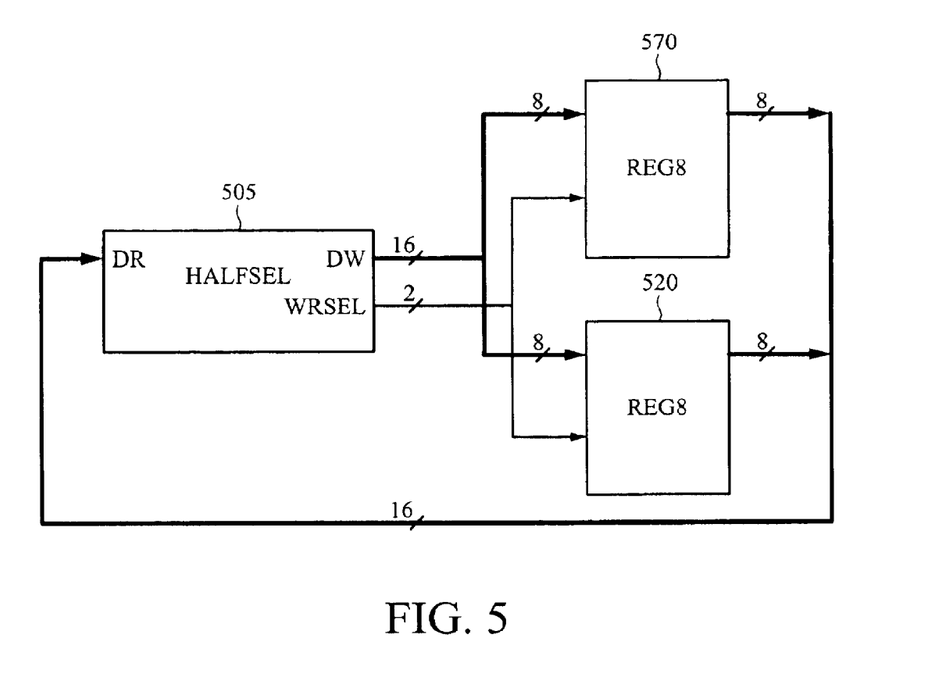
FIG. 5 is an exemplary logic diagram using a data access primitive.

FIG. 5 is an exemplary logic diagram showing a HALFSEL data access primitive in an equivalent logic to that in FIG. 1. The HALFSEL data access primitive 505 includes the data read (DR) port, the data write (DW) port and the data write select (DWSEL) port. The DWSEL port has two lines. Although not shown, the HALFSEL 505 also include the ports shown in FIG. 2. The HALFSEL 505 is connected to a two-byte register with individually addressable bytes 510 and 520. Each of the two write-select lines of the HALFSEL data access primitive 505 is connected to the write-enable input of one of the 8-bit registers 510 and 520. Each of the two bytes of DW port of the HALFSEL data access primitive 505 is connected to the data input of one of the 8-bit registers 510 and 520. The data output of the register 510 and the register 520 are combined to form the two bytes of data input to the HALFSEL data access primitive 505 and is connected to the DR port.

Assume that the address allocator program assigns the address 0x00000004 to the HALFSEL data access primitive 505. The data access technology mapper program converts the HALFSEL data access primitive 505 into a single address-matching function and two lane-matching functions. The address-matching function matches either address 0x00000004 or 0x00000005 (two bytes in the halfword). The first lane matching function matches only transactions that include the byte at 0x00000004. The second lane matching function matches only transactions that include the byte at 0x00000005. The data access technology mapper program also produces sixteen connections to the data-write (DW) port and sixteen connections to the data-read (DR) port. It also produces other auxiliary logic and connections. For example, in a 32-bit system bus, there are four transactions that pass the address matching function (i.e., matches):

1. A word-wide transaction at 0x00000004
2. A halfword-wide transaction at 0x00000004
3. A byte-wide transaction at 0x00000004
4. A byte-wide transaction at 0x00000005.

The transactions 1, 2, and 3 match the first lane-matching function (transactions that contain 0x00000004). The transactions 1, 2, and 4 match the second lane-matching function (transactions that contain 0x00000005).

Figure 6:
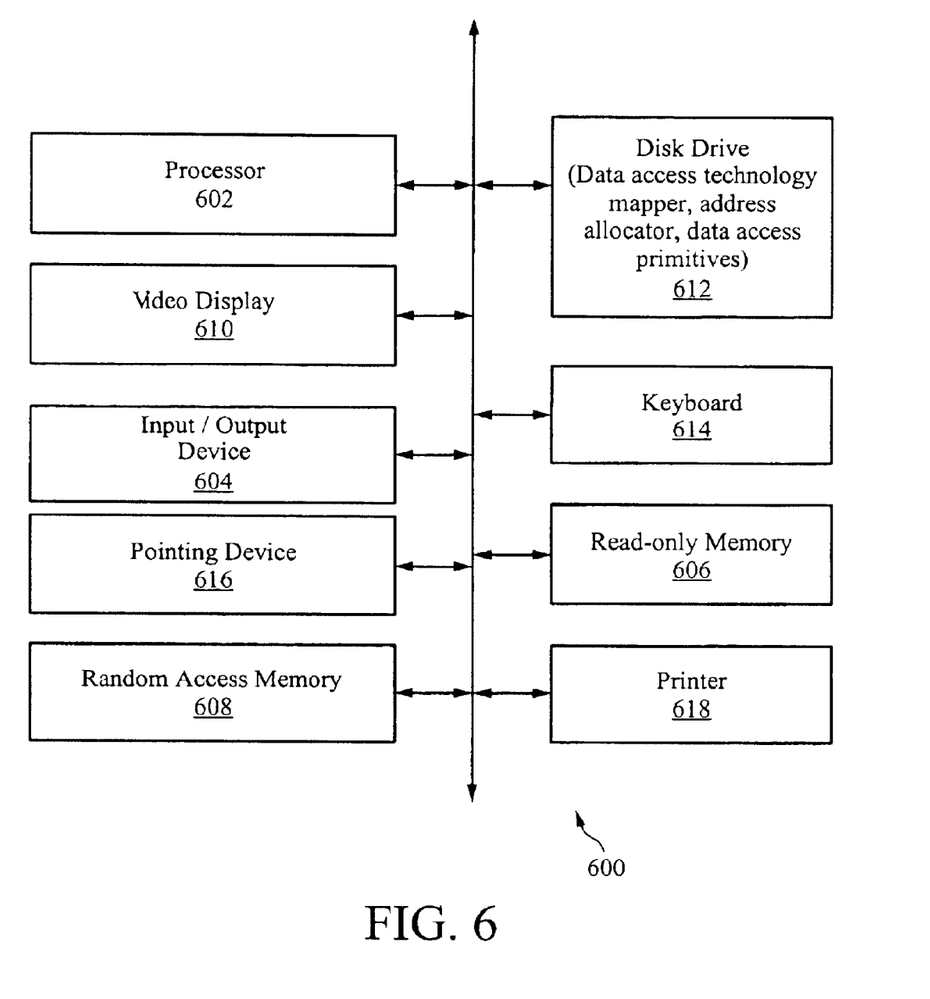
FIG. 6 illustrates an embodiment of a computer system that can be used with the present invention.

FIG. 6 illustrates an embodiment of a computer system that can be used with the present invention. The various components shown in FIG. 6 are provided by way of example. Certain components of the computer in FIG. 6 can be deleted from the addressing system for a particular implementation of the invention. The computer shown in FIG. 6 may be any type of computer including a general-purpose computer.

FIG. 6 illustrates a system bus 600 to which various components are coupled. A processor 602 performs the processing tasks required by the computer. Processor 602 may be any type of processing device capable of implementing the method discussed above. An input/output (I/O) device 604 is coupled to bus 600 and provides a mechanism for communicating with other devices coupled to the computer. A read-only memory (ROM) 606 and a random access memory (RAM) 608 are coupled to bus 600 and provide a storage mechanism for various data and information used by the computer. Although ROM 606 and RAM 608 are shown coupled to bus 600, in alternate embodiments, ROM 606 and RAM 608 are coupled directly to processor 602 or coupled to a dedicated memory bus (not shown).

A video display 610 is coupled to bus 600 and displays various information and data to the user of the computer. A disk drive 612 is coupled to bus 600 and provides for the long-term mass storage of information. Disk drive 612 may be used to store various software programs including the data access technology mapper program and the address allocator program. Disk drive 612 may also store the data access primitives and the source HDL programs used by the logic designer to model the circuit. Disk drive 612 may also store a synthesis program. A keyboard 614 and pointing device 616 are also coupled to bus 600 and provide mechanisms for entering information and commands to the computer. A printer 618 is coupled to bus 600 and is capable of creating a hard-copy of information generated by or used by the computer.

Figure 7:
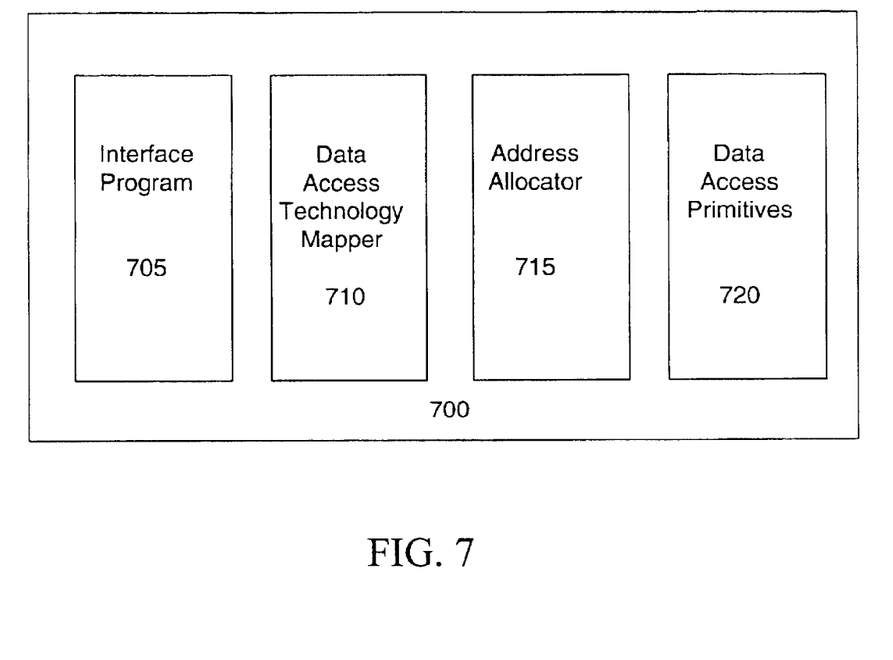
FIG. 7 illustrates an embodiment of a computer-readable medium.

FIG. 7 illustrates an embodiment of a computer-readable medium 700 containing various sets of instructions, code sequences, configuration information, and other data used by a computer or other processing device. The various information stored on medium 700 is used to perform various data processing operations. Computer-readable medium 700 is also referred to as a processor-readable medium. Computer-readable medium 700 can be any type of magnetic, optical, or electrical storage medium including a diskette, magnetic tape, CD-ROM, memory device, or other storage medium.

Computer-readable medium 700 includes interface code 705 that controls the flow of information between various devices or components in the computer system. Interface code 705 may control the transfer of information within a device (e.g., between the processor and a memory device), or between an input/output port and a storage device. Additionally, interface code 705 may control the transfer of information from one device to another. Computer-readable medium 700 may also includes the data access techlology mapper program 710, the address allocator program 715, and the data access primitives 720.

Thus, using the method disclosed, the logic designer can leave the address of a memory-mapped device unspecified, allowing the address allocator and data access technology mapper to decide the details of address-matching, lane-matching, and bus connectivity. The logic designer can change the addresses assigned to memory-mapped logic devices without changing the logic design.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. A method comprising:
    using a logic design component to specify addressability for a memory-mapped device, addressability comprising an address matching function configured to process an address range for a set of transactions at different data byte sizes, a lane matching function selecting an address in part of the address range, and one or more bus connections;
    specifying a first starting address for the memory-mapped device; and
    replacing the logic design component with logic components that implement a first set of addressing matching function, lane matching function and one or more bus connections for the memory-mapped device based upon the logic design component and the first starting address.

2. The method of claim 1, further comprising replacing the logic design component with logic components that implement a second set of addressing matching function, lane matching function and one or more bus connections for the memory-mapped device based upon the logic design component and a second starting address, wherein the lane matching function of the second set is responsive to an address output by the addressing matching function of the second set.

3. The method of claim 1, further comprising:
    coupling the logic design component to the memory-mapped device; and
    coupling an address bus to the logic design component.

4. The method of claim 3, wherein the addressing matching function compares an address from the address bus with the first starting address for the memory-mapped device.

5. The method of claim 4, wherein the first starting address is specified by a user.

6. The method of claim 4, wherein the first starting address is generated automatically.

7. The method of claim 6, wherein the first starting address is generated automatically using a set of address constraints.

8. The method of claim 1, wherein the logic design component is selected to allow addressability for a minimum size transaction supported by the memory-mapped device.

9. The method of claim 8, wherein the memory-mapped device is a register.

10. A computer readable medium containing executable instructions which, when executed in a processing system, causes the processing system to perform a method comprising:
    using a logic design component to specify addressability for a memory-mapped device, addressability comprising an address matching function configured to process an address range for a set of transactions at different data byte sizes, a lane matching function selecting an address in part of the address range, and one or more bus connections;
    specifying a first starting address for the memory-mapped device; and
    replacing the logic design component with logic components that implement a first set of addressing matching function, lane matching function and one or more bus connections for the memory-mapped device based upon the logic design component and the first starting address.

11. The computer readable medium of claim 10, further comprising replacing the logic design component logic components that implement a second set of addressing matching function, lane matching function and one or more bus connections for the memory-mapped device based upon the logic design component and a second starting address.

12. The computer readable medium of claim 10, further comprising:
    coupling the logic design component to the memory-mapped device; and
    coupling an address bus to the logic design component.

13. The computer readable medium of claim 12, wherein the addressing matching function compares an address from the address bus with the first starting address for the memory-mapped device.

14. The computer readable medium of claim 13, wherein the first starting address is specified by a user.

15. The computer readable medium of claim 13, wherein the first starting address is generated automatically.

16. The computer readable medium of claim 15, wherein the first starting address is generated automatically using a set of address constraints.

17. The computer readable medium of claim 10, wherein the memory-mapped device is selected to allow addressability for a minimum size transaction supported by the memory-mapped device.

18. A method, comprising:
    selecting a logic design component to provide data access of a desired transaction size, and to indicate an addressing matching function configured to process an address range for a set of transactions at different data byte sizes, a lane matching function selecting an address in part of the address range, and one or more bus connections for a memory-mapped device;

specifying an address constraint for the memory-mapped device;

instantiating a logic for the memory-mapped device, comprising:

generating a starting address for the memory mapped device using the address constraint;

using the selected logic design component and the starting address to map the logic for the memory mapped device capable of being accessed at the desired transaction size, comprising:

generating first logic components that implement the address matching function, and generating second logic components that implement the lane matching function and the one or more bus connections.

19. The method of claim 18, wherein the address constraint is specified by a user, and wherein the starting address for the memory mapped device is generated automatically.

20. The method of claim 18, wherein the transaction size is one in a group comprising a byte, a halfword and a word.

21. The method of claim 18, further comprising using a new starting address for the memory-mapped device without having to specify changes to the addressing function, the lane matching function and the one or more bus connections.

22. The method of claim 21, wherein different logic for the memory mapped device is instantiated automatically using the same logic design component and the new starting address.

23. The method of claim 18, wherein the addressing matching function compares an address from an address bus coupled with the logic design component with the starting address, and wherein when there is match, the lane matching function matching the transaction size of a transaction to a respective section of the memory-mapped device.

24. A computer readable medium containing executable instructions which, when executed in a processing system, causes the processing system to perform a method, comprising:

selecting a logic design component to provide data access of a desired transaction size, and to indicate an addressing matching function, configured to process an address range for a set of transactions at different data byte sizes, a lane matching function selecting an address in part of the address range, and one or more bus connections for a memory-mapped device;

specifying an address constraint for the memory-mapped device;

instantiating a logic for the memory-mapped device, comprising:

generating a starting address for the memory mapped device using the address constraint;

using the selected logic design component and the starting address to map the logic for the memory mapped device capable of being accessed at the desired transaction size, comprising:

generating first logic components that implement the address matching function, and generating second logic components, coupled to the first logic components, that implement the lane matching function and the one or more bus connections.

25. The computer readable medium of claim 24, wherein the address constraint is specified by a user, and wherein the starting address for the memory mapped device is generated automatically.

26. The computer readable medium of claim 24, wherein the transaction size is one in a group comprising a byte, a halfword and a word.

27. The computer readable medium of claim 24, further comprising using a new starting address for the memory-mapped device without having to specify changes to the addressing function, the lane matching function and the one or more bus connections.

28. The computer readable medium of claim 27, wherein different logic for the memory mapped device is instantiated automatically using the same logic design component and the new starting address.

29. The computer readable medium of claim 24, wherein the addressing matching function compares an address from an address bus coupled with the logic design component with the starting address, and wherein when there is match, the lane matching function matching the transaction size of a transaction to a respective section of the memory-mapped device.

* * * * *